(12) United States Patent
Takeya

(10) Patent No.: US 6,861,340 B2
(45) Date of Patent: Mar. 1, 2005

(54) METHOD OF HEAT-TREATING NITRIDE COMPOUND SEMICONDUCTOR LAYER AND METHOD OF PRODUCING SEMICONDUCTOR DEVICE

(75) Inventor: Motonobu Takeya, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/326,072

(22) Filed: Dec. 23, 2002

(65) Prior Publication Data

US 2003/0124877 A1 Jul. 3, 2003

Related U.S. Application Data

(62) Division of application No. 09/924,615, filed on Aug. 9, 2001, now Pat. No. 6,524,976.

(30) Foreign Application Priority Data

Aug. 10, 2000 (JP) .................................... P2000-241967

(51) Int. Cl.⁷ .................... H01L 21/265; H01L 21/425; H01L 21/21; H01L 21/324
(52) U.S. Cl. ...................... 438/522; 438/508; 438/509; 438/796
(58) Field of Search ................................ 438/507, 508, 438/509, 522, 796, 797, 799, 604, 605

(56) References Cited

U.S. PATENT DOCUMENTS

| | | | |
|---|---|---|---|
| 5,306,662 A | 4/1994 | Nakamura et al. .......... 437/107 |
| 5,468,678 A | 11/1995 | Nakamura et al. .......... 437/107 |
| 6,169,297 B1 | 1/2001 | Jang et al. | |
| 6,242,328 B1 * | 6/2001 | Shin ............................ 438/518 |
| 6,268,618 B1 * | 7/2001 | Miki et al. .................... 257/99 |
| 6,287,947 B1 * | 9/2001 | Ludowise et al. .......... 438/606 |
| 6,319,808 B1 * | 11/2001 | Ho et al. ..................... 438/597 |
| 6,326,294 B1 * | 12/2001 | Jang et al. .................. 438/604 |
| 6,335,212 B1 * | 1/2002 | Uemura et al. ............... 438/26 |
| 6,495,433 B2 * | 12/2002 | Shin ............................ 438/569 |
| 2002/0004254 A1 | 1/2002 | Miki | |
| 2002/0185732 A1 * | 12/2002 | Ho et al. ..................... 257/734 |

FOREIGN PATENT DOCUMENTS

| | | |
|---|---|---|
| JP | 2-257679 | 10/1990 |
| JP | 5-183189 | 7/1993 |
| JP | 2-540791 | 7/1996 |

OTHER PUBLICATIONS

The '662 patent claims priority from ref. AG as filed.

The '678 patent claims priority from ref. AG as filed.

* cited by examiner

*Primary Examiner*—Erik Kielin
(74) *Attorney, Agent, or Firm*—Rader, Fishman & Grauer PLLC; Ronald P. Kananen

(57) ABSTRACT

A method of heat-treating a nitride compound semiconductor layer, comprising heating a nitride compound semiconductor layer doped with a p-type impurity at a temperature that is at least 200° C. but less than 400° C. for at least 100 minutes.

6 Claims, 5 Drawing Sheets

METHOD OF HEAT-TREATING NITRIDE COMPOUND SEMICONDUCTOR LAYER AND METHOD OF PRODUCING SEMICONDUCTOR DEVICE

This application is a divisional application of Ser. No. 09/924,615 filed Aug. 9, 2001 now U.S. Pat. No. 6,524,976.

BACKGROUND OF THE INVENTION AND RELATED ART STATEMENT

The present invention relates to a method of heat-treating a nitride compound semiconductor layer and a method of producing a semiconductor device.

In recent years, gallium nitride compound semiconductors such as GaN, an AlGaN compound crystal and an AlInGaN compound crystal are considered promising as component materials for semiconductor devices that can emit light in the range of from a visible light region to an ultraviolet light region. Particularly, since a light emitting diode (LED) using a gallium nitride compound semiconductor has come to be commercially used, the gallium nitride compound semiconductor devices have been of great interest. Further, a semiconductor laser (laser diode, LD) using a gallium nitride compound semiconductor has been reportedly realized as well, and applications thereof including a light source for an optical disk are expected.

When a gallium nitride compound semiconductor layer doped with a p-type impurity is formed by a vapor deposition method, the gallium nitride compound semiconductor layer formed by such a method does not become a p-type, but it constitutes a semi-insulating layer having a high resistance of at least $10^8$ Ω·cm or more, i.e., an i-type compound semiconductor layer.

There is known a method of decreasing the resistance of the above i-type compound semiconductor layer having a high resistance to convert it to a p-type compound semiconductor layer, as is disclosed, for example, in JP-A-2-257679. In the method disclosed in JP-A-2-257679, the surface of an i-type gallium nitride compound semiconductor layer obtained by doping the layer with Mg as a p-type impurity is irradiated with electron beam to decrease the resistance of the surface of the gallium nitride compound semiconductor layer. In the above method, however, it is only of the surface of the gallium nitride compound semiconductor layer that the resistance can be decreased, and the above treatment takes a long time due to scanning with electron beam. Further, there is involved a problem that it is difficult to uniformly decrease the resistance of the gallium nitride compound semiconductor layer in a wafer plane.

Published Japanese Patent No. 2540791 discloses a technique of growing a gallium nitride compound semiconductor doped with a p-type impurity by a vapor deposition method, and heat-treating the semiconductor at a temperature of 400° C. or higher or at a temperature of 600° C. or higher for attaining a practical carrier concentration. The above heat-treatment is carried out in vacuum or an inert gas atmosphere free of hydrogen atoms of $NH_3$ or $H_2$ for approximately 10 to 20 minutes.

In production of a semiconductor laser (LD), however, diffusion of a p-type impurity such as Mg is presumably more liable to take place, or the sharpness of an interface in a superlattice structure is presumably more liable to be disintegrated by the diffusion of In with an increase in the heat treatment temperature, and the deterioration of an active layer such as an increase in threshold voltage $I_{th}$ and a decrease in lifetime is liable to proceed easily.

Further, when the heat treatment is carried out at a high temperature, deterioration takes place in the surface of the gallium nitride compound semiconductor layer due to dissociation of nitrogen atoms. For preventing the above phenomenon, Published Japanese Patent No. 2540791 also discloses a technique for forming a cap layer on the surface of a gallium nitride compound semiconductor layer. However, the material for constituting the cap layer is selected from $Ga_xAl_{1-x}N$ (0≦x≦1), AlN, $Si_3N_4$ or $SiO_2$, and finally, it is required to remove the cap layer made of such a material from the surface of the gallium nitride compound semiconductor layer, which results in a problem that the number of manufacturing steps increases.

OBJECT AND SUMMARY OF THE INVENTION

It is therefore an object of the present invention to provide a method of heat-treating a nitride compound semiconductor layer in which the resistance of a nitride compound semiconductor layer doped with a p-type impurity can be decreased, and the nitride compound semiconductor layer can be activated, at a far lower temperature than a temperature employed by any conventional method, and a method of producing a semiconductor device by applying the above method of heat-treating a nitride compound semiconductor layer.

According to a first aspect of the present invention for achieving the above object, there is provided a method of heat-treating a nitride compound semiconductor layer, which method comprises heating a nitride compound semiconductor layer doped with a p-type impurity at a temperature that is at least 200° C. but less than 400° C., preferably that is at least 225° C. but less than 400° C., more preferably that is at least 250° C. but less than 400° C., still more preferably that is at least 300° C. but less than 400° C., for at least 100 minutes, preferably for at least 200 minutes, more preferably for at least 500 minutes, still more preferably at least 20 hours, yet more preferably for at least 30 hours, far more preferably for at least $3 \times 10^3$ minutes (50 hours), further more preferably for at least $1 \times 10^2$ hours.

According to a first aspect of the present invention for achieving the above object, there is also provided a method of producing a semiconductor device, which method includes the step of heating a nitride compound semiconductor layer, which step comprises heating a nitride compound semiconductor layer doped with a p-type impurity at a temperature that is at least 200° C. but less than 400° C., preferably that is at least 225° C. but less than 400° C., more preferably that is at least 250° C. but less than 400° C., still more preferably that is at least 300° C. but less than 400° C., for at least 100 minutes, preferably for at least 200 minutes, more preferably for at least 500 minutes, still more preferably at least 20 hours, yet more preferably for at least 30 hours, far more preferably for at least $3 \times 10^3$ minutes (50 hours), further more preferably for at least $1 \times 10^2$ hours.

According to a second aspect of the present invention for achieving the above object, there is provided a method of heat-treating a nitride compound semiconductor layer, which method comprises heat-treating a nitride compound semiconductor layer doped with a p-type impurity in a state where the heating time period t (unit: minute) and the heating temperature T (unit: K) satisfy conditions of t≧100, preferably t≧200, more preferably t≧500, still more preferably t≧$2 \times 10^3$ and the following equation (1), $$T \geq \alpha/[\ln(\sqrt{t}) + \ln(D_0) - \ln(C)] \qquad (1)$$

wherein α is a coefficient that is $1.04 \times 10^4$, $\ln(D_0)$ is a coefficient that is 53 and C is a carrier concentration (unit:

cm$^{-3}$) of the nitride compound semiconductor layer after the heat treatment thereof.

According to a second aspect of the present invention for achieving the above object, there is also provided a method of producing a semiconductor device, which method includes the step of heat-treating a nitride compound semiconductor layer doped with a p-type impurity in a state where the heating time period t (unit: minute) and the heating temperature T (unit: K) satisfy conditions of t≧100, preferably t≧200, more preferably t≧500, still more preferably t≧2×10$^3$ and the abovementioned equation (1).

In the method of heat-treating a nitride compound semiconductor layer or the method of producing a semiconductor device according to the second aspect of the present invention (these methods will be sometimes generally referred to as "method according to the second aspect of the present invention" hereinafter), desirably, the heating temperature T (K) is brought into a state where the condition of 473 (K)≦T<673 (K), preferably 498 (K)≦T<673 (K), more preferably 523 (K)≦T<673 (K), still more preferably 573 (K)≦T<673 (K) is satisfied. When the heating temperature T is expressed in terms of degree Celsius, the heating temperature is desirably a temperature that is at least 200° C. but less than 400° C., preferably that is at least 225° C. but less than 400° C., more preferably that is at least 250° C. but less than 400° C., still more preferably that is at least 300° C. but less than 400° C. Further, the carrier concentration of the nitride compound semiconductor layer after the heat treatment is at least 1.0×10$^{17}$ cm$^{-3}$, preferably at least 3.0×10$^{17}$ cm$^{-3}$, more preferably 5.0×10$^{17}$ cm$^{-3}$, still more preferably 1.0×10$^{18}$ cm$^{-3}$.

In the method of heat-treating a nitride compound semiconductor layer or the method of producing a semiconductor device according to the first aspect of the present invention (these methods will be sometimes generally referred to as "method according to the first aspect of the present invention" hereinafter) or the method according to the second aspect of the present invention, the heating atmosphere can be an aerial atmosphere (having a pressure that may be atmospheric pressure, a reduced pressure or an elevated pressure). Alternatively, the heating atmosphere can be an atmosphere supplied at least with an oxygen gas, and in this case, the heating atmosphere may be an atmosphere supplied with an oxygen gas alone, an atmosphere supplied with an oxygen gas and a hydrogen gas, an atmosphere supplied with an oxygen gas and steam, or an atmosphere supplied with an oxygen gas, a hydrogen gas and steam. Further, the heating atmosphere may be an atmosphere supplied with an inert gas in addition to these. Alternatively, the heating atmosphere may be an inert gas atmosphere or a reduced-pressure atmosphere having a pressure lower than atmospheric pressure, and in this case, the heating atmosphere may contain steam. The inert gas can be selected from nitrogen (N$_2$) gas, helium (He) gas, neon (Ne) gas, argon (Ar) gas, or mixtures of these gases. When an oxygen gas and a hydrogen gas are supplied, or when an oxygen gas, a hydrogen gas and steam are supplied, the amount ratio of the hydrogen gas in a mixture of the oxygen gas and the hydrogen gas is required to be less than the lower limit (4% by volume) of a combustion range. The supply ratio of the oxygen gas/steam and the amount ratio of the steam in the inert gas atmosphere or the reduced-pressure atmosphere are essentially arbitrary.

According to a third aspect of the present invention for achieving the above object, there is provided a method of heat-treating a nitride compound semiconductor layer, which method comprises heating a nitride compound semiconductor layer doped with a p-type impurity, at a temperature that is at least 200° C. but not higher than 1200° C., in one atmosphere selected from;

(A) aerial atmosphere, (B) an atmosphere supplied with an oxygen gas and a hydrogen gas, (C) an atmosphere supplied with an oxygen gas and steam, (D) an atmosphere supplied with an oxygen gas, a hydrogen gas and steam, (E) an inert gas atmosphere containing steam, or (F) a reduced-pressure atmosphere containing steam and having a pressure lower than atmospheric pressure.

According to a third aspect of the present invention for achieving the above object, there is also provided a method of producing a semiconductor device, which method includes the step of heating a nitride compound semiconductor layer doped with a p-type impurity, at a temperature that is at least 200° C. but not higher than 1200° C., in one atmosphere selected from;

(A) aerial atmosphere, (B) an atmosphere supplied with an oxygen gas and a hydrogen gas, (C) an atmosphere supplied with an oxygen gas and steam, (D) an atmosphere supplied with an oxygen gas, a hydrogen gas and steam, (E) an inert gas atmosphere containing steam, or (F) a reduced-pressure atmosphere containing steam and having a pressure lower than atmospheric pressure.

In the method of heat-treating a nitride compound semiconductor layer or the method of producing a semiconductor device according to the third aspect of the present invention (these methods will be sometimes generally referred to as "method according to the third aspect of the present invention" hereinafter), the amount ratio of the hydrogen gas in a mixture of the oxygen gas and the hydrogen gas in the atmosphere supplied with an oxygen gas and a hydrogen gas or the atmosphere supplied with an oxygen gas, a hydrogen gas and steam is required to be less than the lower limit (4% by volume) of a combustion range. Further, the supply ratio of the oxygen gas/steam in the atmosphere supplied with an oxygen gas and a hydrogen gas and the amount ratio of the steam in the inert gas atmosphere or the reduced-pressure atmosphere are essentially arbitrary. Further, the above atmosphere are essentially arbitrary. Further, the above atmospheres (A) to (E) may be in a state having any one of atmospheric pressure, a reduced pressure and an elevated pressure. Further, the above atmospheres (B), (C) and (D) may contain the above inert gas.

In the method according to the third aspect of the present invention, desirably, the lower limit of the heating temperature is at least 200° C., preferably at least 225° C., more preferably at least 250° C., still more preferably at least 300° C. Desirably, the upper limit of the heating temperature is 1200° C. or lower, preferably 700° C. or lower, more preferably 600° C. or lower, still more preferably 500° C. or lower, yet more preferably less than 400° C. When the upper limit of the heating temperature is set at 700° C. or lower, the sharpness of an interface in a superlattice structure is less liable to be disintegrated by the diffusion of atoms (for example, In) constituting the nitride compound semiconductor layer. Further, when the upper limit of the heating temperature is set at 600° C. or lower, further at 500° C. or lower, further at a temperature lower than 400° C., the dissociation of nitrogen atoms from the nitride compound semiconductor layer can be more reliably prevented, and the diffusion of a p-type impurity such as Mg, etc., is less liable to take place. Further, the surface of the nitride compound semiconductor layer is less liable to be oxidized although its degree differs depending upon an atmosphere employed for the heat-treatment.

In the method according to the first, second or third aspect of the present invention, there may be employed a constitution in which a hydrogen-permeable film is formed on the surface of the nitride compound semiconductor layer. In this constitution, examples of a material for constituting the hydrogen-permeable film include so-called hydrogen-occlusion metals such as palladium (Pd) and hydrogen-occlusion alloys. The thickness of the hydrogen-permeable film is not specially limited so long as the dissociation of nitrogen atoms from the nitride compound semiconductor layer by the heat treatment can be prevented. The hydrogen-permeable film can be formed by a physical-vapor deposition method (PVD method) such as a sputtering method and a vacuum deposition method or a chemical vapor deposition method (CVD method). For example, a hydrogen-permeable film made of palladium (Pd) is permeable to hydrogen gas at a high temperature, so that it can release hydrogen atoms in the nitride compound semiconductor layer to the heat-treatment atmosphere and can prevent oxidation of the surface of the nitride compound semiconductor layer. Further, palladium can be easily peeled off the nitride compound semiconductor layer and can be also used as a p-side electrode, so that it does not cause the number of steps in the process of producing a semiconductor device, etc., to increase much as compared with the cap layer disclosed in Published Japanese Patent 2540791.

The nitride compound semiconductor layer in the present invention specifically includes GaN, an AlGaN compound crystal, an AlInGaN compound crystal, a BAlInGaN compound crystal, an InGaN compound crystal, InN and AlN. And, it can be formed by a metal organic chemical vapor deposition method (MOCVD method) or a molecular beam epitaxial method (MBE method). The p-type impurity includes Mg, Zn, Cd, Be, Ca, Ba and O.

In the method of producing a semiconductor device according to the first, second or third aspect of the present invention, the semiconductor device includes a semiconductor laser (laser diode, LD), a light-emitting diode (LED) and a transistor such as HBT.

The above heat treatment can be carried out, for example, with an electric oven, various heating apparatuses including heating apparatuses using hot gases such as a hot-air heating apparatus, or an apparatus for irradiation with light or electromagnetic wave such as infrared beam, ultraviolet beam or microwave.

In the method according to the first aspect of the present invention, the heating temperature is set at a temperature that is at least 200° C. but less than 400° C., namely lower than that employed in any conventional method, and the heat treatment is carried out for a longer period of time than that employed in any conventional method, whereby the resistance of the nitride compound semiconductor layer can be decreased and the nitride compound semiconductor layer can be activated. In the method according to the second aspect of the present invention, the heat treatment is carried out under the conditions where the heating temperature T and the heating time period t satisfy $t \geq 100$ and the equation (1), whereby the resistance of the nitride compound semiconductor layer can be reliably decreased and the nitride compound semiconductor layer can be reliably activated. In the method according to the third aspect of the present invention, the heat treatment is carried out in the atmosphere containing an oxygen gas or containing steam, so that the lower limit of the heating temperature can be decreased as compared with a conventional method. Further, in the method according to the first, second or third aspect of the present invention, the heating atmosphere is selected from aerial atmosphere or an atmosphere supplied at least with an oxygen gas, so that the resistance of the nitride compound semiconductor layer can be decreased and the nitride compound semiconductor layer can be activated for a short heating time period. This is presumably because water, for example, contained in aerial atmosphere works as a kind of catalyst, or oxygen works as a kind of catalyst, on the surface of the nitride compound semiconductor layer during the heat treatment so that the water or oxygen promotes dissociation of hydrogen in the nitride compound semiconductor layer.

BRIEF DESCRIPTION OF THE DRAWINGS

The present invention will be explained with reference to Examples with referring to drawings hereinafter.

DESCRIPTION OF THE PREFERRED EMBODIMENTS

EXAMPLE 1

Figure 5:
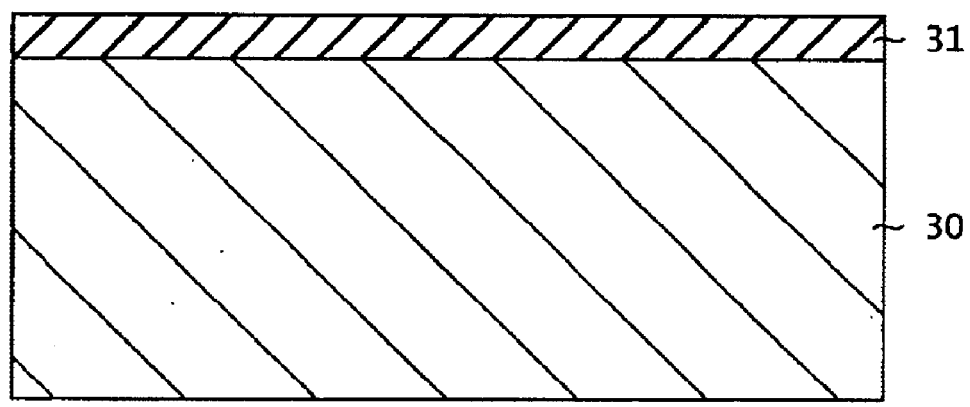
FIG. 5 shows a schematic cross-sectional view of a hydrogen-permeable film on the surface of a nitride compound semiconductor layer.

Example 1 is concerned with the methods of heat-treating a nitride compound semiconductor layer 30 of FIG. 5 according to the first, second and third aspects of the present invention. Example 1 employed an aerial atmosphere (pressure: atmospheric pressure) as a heating atmosphere.

In Example 1, first, a 40 nm thick buffer layer was formed on a sapphire substrate (not shown), then, a 1 μm thick non-doped GaN layer (now shown) that contained no impurity was formed thereon, and further, a 1 μm thick nitride compound semiconductor layer 30 made of GaN containing Mg as a p-type impurity was formed on the GaN layer. These layers were formed by an MOCVD method. The thus-obtained sample was cut into pieces having dimensions of 5 mm×5 mm, and 0.3 μm thick electrodes 31 made of palladium (Pd) were formed on four corners by a vapor deposition method, to prepare test samples for heat-treatment evaluation.

The above test samples for heat-treatment evaluation were placed on hot plates made of stainless steel at T° C. (specifically, 385° C., 415° C., 485° C.), weights made of stainless steel were placed on the test samples to increase adhesion between the test samples for heat-treatment evaluation and the hot plates. Aerial atmosphere (average temperature 28° C., average relative humidity 68%) was employed as a heating atmosphere. During the heat treatment, hydrogen was released from the test samples through vary small gaps between the hot plates and the test samples.

After a predetermined period of time, each test sample for heat-treatment evaluation was removed from the hot plate and measured for an electric resistance and a hole coefficient according to a van der Pauw method. Then, the test samples were again placed on the hot plates to continue the heat treatment.

As shown within FIG. 5, a test sample for heat-treatment evaluation, prepared by forming a 0.3 μm thick hydrogen-permeable film 31 made of palladium (Pd) on a 1 μm thick nitride compound semiconductor layer 30 made of GaN containing Mg as a p-type impurity, was also measured for an electric resistance and a hole coefficient. Concerning the test sample in this case, the hydrogen-permeable film 31 corresponding to the electrodes was retained and other portions of the hydrogen-permeable film 31 were removed by etching before the measurement of an electric resistance and a hole coefficient.

Figure 1:
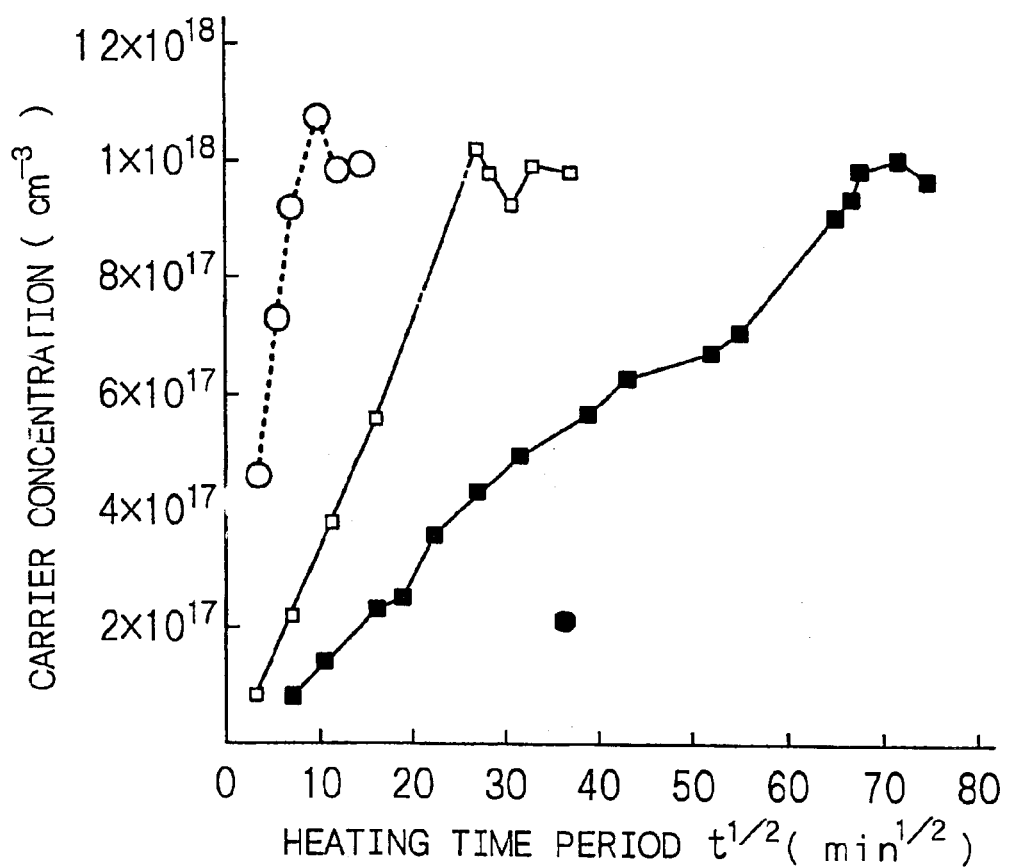
FIG. 1 is a graph showing carrier concentrations based on hole coefficient measurements at heating temperatures T of 385° C., 415° C. and 485° C.
Figure 2:
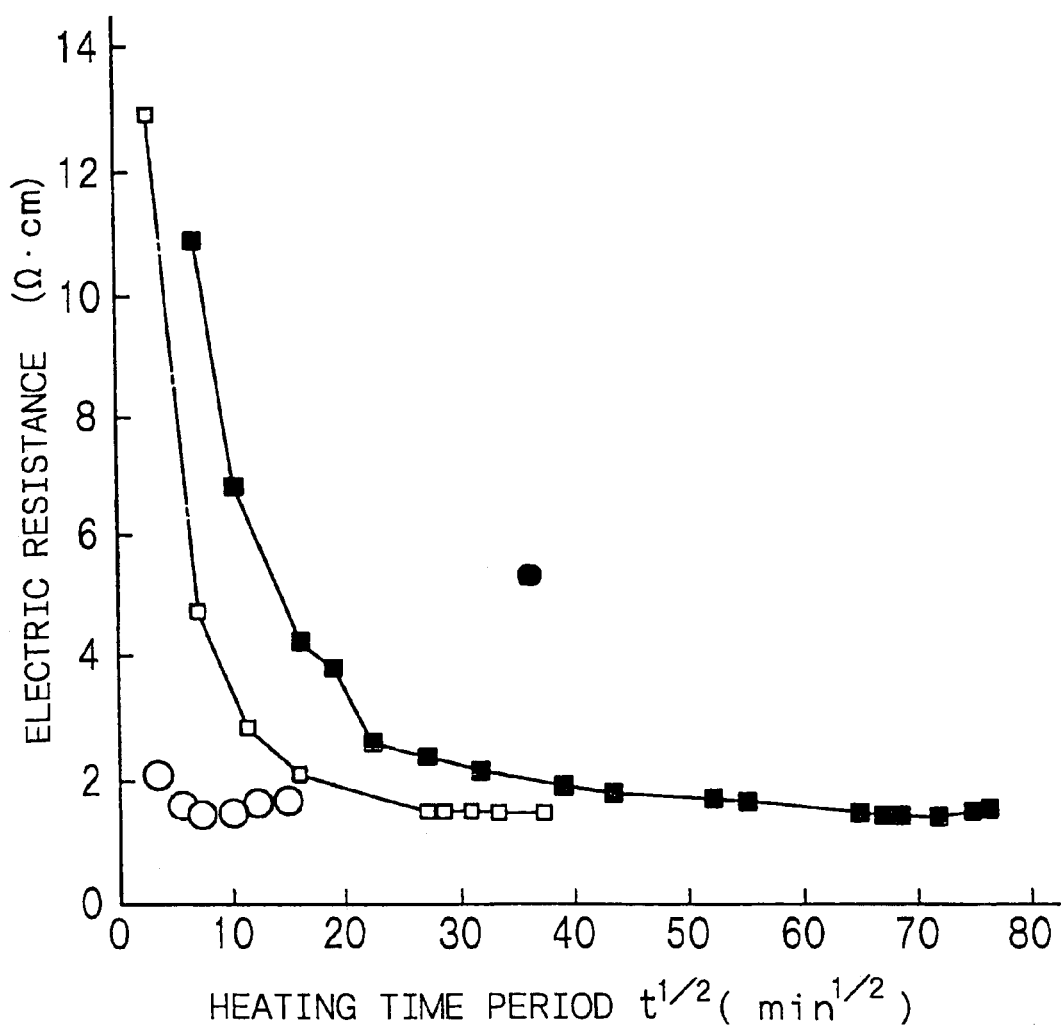
FIG. 2 is a graph showing electric resistance values at heating temperatures T of 385° C., 415° C. and 485° C.

FIGS. 1 and 2 show the electric resistance values at T=385° C., 415° C. and 485° C. and the carrier concentrations based on results of the hole coefficient measurement. In the graph of FIG. 1, the axis of abscissas shows square roots of heating time period t (unit: minute), and the axis of ordinates shows the carrier concentrations. In the graph of FIG. 2, the axis of abscissas shows square roots of heating time period t (unit: minute), and the axis of ordinates shows results of the electric resistance measurement. In FIG. 1, solid square marks show the carrier concentrations at T=385° C., blank square marks show the carrier concentrations at T=415° C., and blank circles show the carrier concentrations at T=485° C. Further, in FIG. 2, solid square marks show the electric resistance values at T=385° C., blank square marks show the electric resistance values at T=415° C., and blank circles show the electric resistance values at T=485° C. Further, a solid circle in FIG. 1 and a solid circle in FIG. 2 show the carrier concentration and the electric resistance value of the test sample having the hydrogen-permeable film 31 at T=385° C. FIGS. 1 and 2 show the following. Even if the heating temperature is lower than 400° C., the carrier concentration increases and the electric resistance decreases with an increase in the heating time period. The measurement results of the test sample having the hydrogen-permeable film 31 are poor as compared with the measurement results of the test samples having no hydrogen-permeable film 31. This is presumably because the diffusion rate of hydrogen decreases due to the hydrogen-permeable film 31.

The results shown in FIG. 1 show that the carrier concentration C is nearly in proportion to the square root of the heating time period t. It is assumed from this result that an increase in the carrier concentration, i.e., activation proceeds on the basis of diffusion, and it can be assumed that the increase in the carrier concentration is according to the following equation (2), wherein T is a heating temperature (unit: K).

$$C = D_0 \cdot \sqrt{t} \cdot \exp[-\alpha/T] \qquad (2)$$

When it is assumed that the carrier concentrations $C_1$, $C_2$ and $C_3$ at the heating temperatures 385° C., 415° C. and 485° C. are in proportion to the square root of the heating time period t, the coefficients $D_1$, $D_2$ and $D_3$ at the heating temperatures 385° C., 415° C. and 485° C. are determined as follows.

$$C_1 = D_1 \sqrt{t} \qquad (3\text{-}1)$$

$$C_2 = D_2 \sqrt{t} \qquad (3\text{-}2)$$

$$C_3 = D_3 \sqrt{t} \qquad (3\text{-}3)$$

As a result, the following results were obtained.

$$D_1 = 1.39 \times 10^{16}$$

$$D_2 = 3.61 \times 10^{16}$$

$$D_3 = 1.17 \times 10^{17}$$

On the basis of the above results, the coefficients $D_0$ and α are determined using the following equation (4). The above values of $D_1$, $D_2$ and $D_3$ are used as values of D. As a result, the coefficient $\ln(D_0) = 53$ and $\alpha = 1.04 \times 10^3$ are obtained.

$$D = D_0 \cdot \exp[-\alpha/T] \qquad (4)$$

The equation (2) is modified to give the following equation (5). When the heating temperature T on the left-side member of the equation (5) is greater than the right-side member, therefore, a desired carrier concentration can be obtained after the heat treatment.

$$T = \alpha/[\ln(\sqrt{t}) + \ln(D_0) - \ln(C)] \qquad (5)$$

Figure 3:
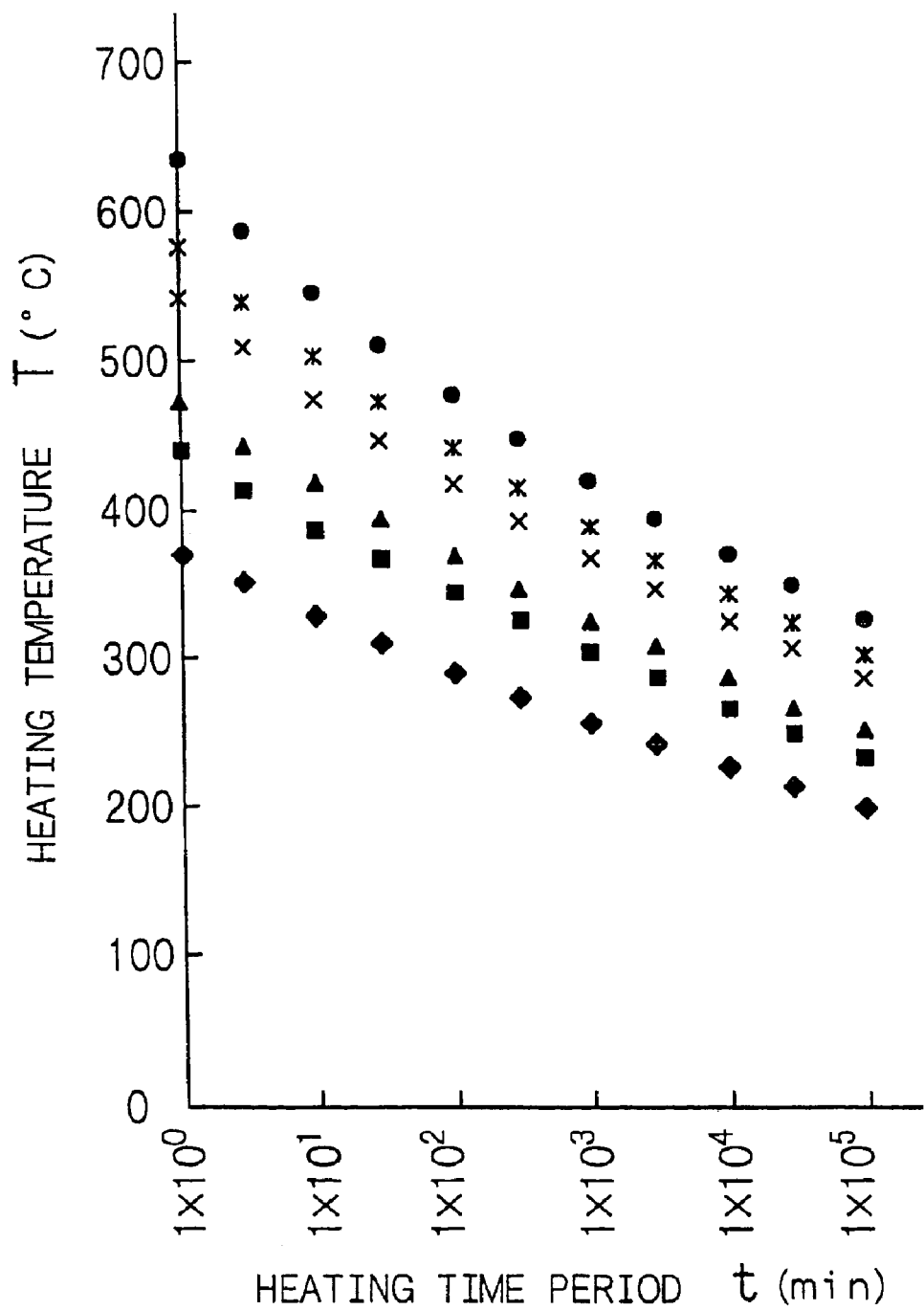
FIG. 3 is a graph showing a relationship between the heating temperature T and the heating time period t when the carrier concentration C of a nitride compound semiconductor layer after heat treatment is varied.

FIG. 3 shows a graph obtained by varying the carrier concentration C (unit: cm$^{-3}$) of the nitride compound semiconductor layer after the heat treatment in equation (5). In FIG. 3, the axis of ordinates shows the heating temperature T (unit: ° C.), and the axis of abscissas shows the heating time period (unit: minute). In FIG. 3, solid rhombic marks show a case where $C = 1 \times 10^{16}$ cm$^{-3}$, solid square marks show a case where $C = 5 \times 10^{16}$ cm$^{-3}$, solid triangular marks show a case where $C = 1 \times 10^{17}$ cm$^{-3}$, "x" marks show a case where $C = 3 \times 10^{17}$ cm$^{-3}$, "*" marks show a case where $C = 5 \times 10^{17}$ cm$^{-3}$, and solid circular marks show a case where $C = 1 \times 10^{18}$ cm$^{-3}$.

The following Tables 1 and 2 show relationships between the heating time period t and the carrier concentration C of the nitride compound semiconductor layer after the heat treatment when the heating temperature is set, for example, at 400° C. and 385° C. The heating time period t of 41 hours or 82 hours is not any critical time period in view of the production of a semiconductor device.

TABLE 1

Heating temperature T = 400° C.

| Carrier concentration C (cm$^{-3}$) | Heating time period t (hour) |
|---|---|
| 3 × 10$^{17}$ | 3.7 |
| 5 × 10$^{17}$ | 10 |
| 1 × 10$^{18}$ | 41 |

TABLE 2

Heating temperature T = 385° C.

| Carrier concentration C (cm$^{-3}$) | Heating time period t (hour) |
|---|---|
| 3 × 10$^{17}$ | 7.4 |
| 5 × 10$^{17}$ | 21 |
| 1 × 10$^{18}$ | 82 |

The above experiments were repeated in the same manner as in the above-described Example 1 except that the aerial atmosphere as a heat-treatment atmosphere was replaced with an atmosphere supplied with an oxygen gas, an atmosphere supplied with an oxygen gas and a hydrogen gas, an atmosphere supplied with an oxygen gas and steam, an atmosphere supplied with an oxygen gas, a hydrogen gas and steam, an inert gas atmosphere, an inert gas atmosphere containing steam, a pressure-reduced atmosphere and a pressure-reduced atmosphere containing steam. As a result, a tendency similar to that obtained in the aerial atmosphere was obtained.

EXAMPLE 2

Example 2 is concerned with the method of producing a semiconductor device that is a semiconductor laser (LD). The method of the above production according to a pressurized MOCVD method that is a kind of a vapor deposition method will be outlined below. In a pressurized MOCVD method, desirably, the MOCVD apparatus for forming various compound semiconductor layers has an internal pressure of 1.1 to 2.0 atmospheric pressures, preferably 1.2 to 1.8 atmospheric pressures. When such a pressurized MOCVD method is employed, there can be reliably prevented a phenomenon that nitrogen is dissociated during the growth of a compound semiconductor layer to cause deficiency of nitrogen in the compound semiconductor layer. In the following explanation, the pressure in the MOCVD apparatus was set at 1.2 atmospheric pressures when various compound semiconductor layers were formed. The pressure in the MOCVD apparatus may be atmospheric pressure. Further, the temperature for forming various compound semiconductor layers other than a buffer layer and an active layer was set at approximately 1000° C., the temperature for forming the active layer was set at 700 to 800° C. for preventing decomposition of In, and the temperature for forming the buffer layer was set at approximately 560° C.

First, a sapphire substrate 10 is introduced into an MOCVD apparatus (not shown), and the MOCVD apparatus is deaerated. Then, while hydrogen gas is flowed, the sapphire substrate 10 is heated to remove oxide on the surface of the sapphire substrate 10. Then, a buffer layer 11 made of GaN is formed on the sapphire substrate 10 by a MOCVD method. For forming each layer, a trimethyl gallium (TMG) gas can be used as a Ga source, and an ammonia gas can be used as an N source.

Then, an n-side contact layer 12 made of an n-type GaN layer containing silicon (Si) as an n-type impurity, an n-type clad layer 13 made of an n-type AlGaN compound crystal layer containing silicon (Si) as an n-type impurity and an n-type guide layer 14 made of an n-type GaN layer containing silicon (Si) as an n-type impurity are consecutively grown. A monosilane gas ($SiH_4$ gas) can be used as an Si source, and trimethyl aluminum (TMA) gas can be used as an Al source.

Then, an active layer 15 having a multiple quantum well structure that is made by stacking $Ga_xIn_{1-x}N$ (in which $X \geqq 0$) compound crystal layers having different compositions is formed on the n-type guide layer 14. A trimethyl indium (TMI) gas can be used as an In source.

After the active layer 15 has grown, a p-type guide layer 16 made of p-type GaN containing magnesium (Mg) as a p-type impurity, a p-type clad layer 17 made of a p-type AlGaN compound crystal layer containing magnesium (Mg) as a p-type impurity and a p-side contact layer 18 made of a p-type GaN layer containing magnesium (Mg) as a p-type impurity are consecutively grown on the active layer 15. A cyclopentadienyl magnesium gas can be used as an Mg source.

Then, heat treatment is carried out, for example, with a hot air dryer substantially in the same manner as in Example 1. The heat treatment was carried out in aerial atmosphere as a heat-treatment atmosphere at a heating temperature of 385° C. for a heating time period of 84 hours (3.5 days). In this manner, the p-type impurity contained in the p-type guide layer 16, the p-type clad layer 17 and the p-type contact layer 18 is activated, and the electric resistance of each of these layers can be decreased.

Figure 4:
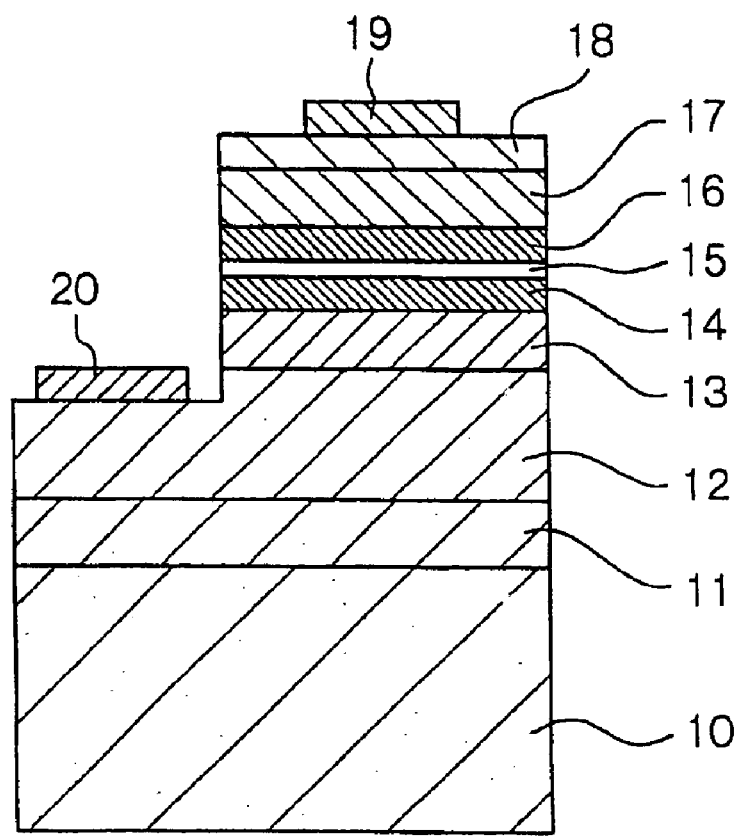
FIG. 4 shows a schematic cross-sectional view of a semiconductor laser (laser diode, LD).

Then, a resist layer is formed on the p-side contact layer 18 such that the p-side contact layer 18 above a position where an n-side electrode 20 is to be formed is exposed. While the resist layer is used as an etching mask, the p-side contact layer 18, the p-type clad layer 17, the p-type guide layer 16, the active layer 15, the n-type guide layer 14 and the n-type clad layer 13 are selectively removed to expose the n-side contact layer 12. Then, the resist layer is removed, and for example, a platinum (Pt) layer and a gold (Au) layer are consecutively deposited on the exposed p-side contact layer 18, to form a p-side electrode 19. Further, for example, a titanium (Ti) layer, an aluminum (Al) layer, a platinum layer and a gold layer are consecutively deposited on the exposed n-type contact layer 12, to form the n-side contact layer 20. Then, heat treatment is carried out to convert the n-side electrode 20 to an alloy. In this manner, the semiconductor laser (LD) whose schematic cross-sectional view is shown in FIG. 4 can be completed.

While the present invention has been explained with reference to preferred embodiments hereinabove, the present invention shall not be limited thereto. Conditions and various values explained in Examples and materials used therein are given for an explanation purpose and can be altered as required. The method of forming each layer made of a nitride compound semiconductor layer shall not be limited to the MOCVD method and may be replaced with an MBE method, a hydride vapor deposition method in which a halogen contributes to transportation or a reaction, or other methods. Further, the sapphire substrate may be replaced with a GaN substrate or an SiC substrate. Further, while Example shows a semiconductor laser (LD) as a semiconductor device, the method of producing a semiconductor device, provided by the present invention, can be applied to the production of a light-emitting diode (LED) or transistors such as HBT.

In the method according to the first aspect of the present invention, the heating temperature is set at a temperature lower than that employed in any conventional method and the heat treatment is carried out for a longer period of heating time period than that employed in any conventional method, whereby the resistance of a nitride compound semiconductor layer can be decreased, and the nitride compound semiconductor layer can be activated. In the method according to the second aspect of the present invention, the heating temperature T and the heating time period t are defined, whereby the resistance of a nitride compound semiconductor layer can be reliably decreased, and the nitride compound semiconductor layer can be reliably activated. Further, in the method according to the third aspect of the present invention, the heat treatment is carried out in an atmosphere containing an oxygen gas or containing steam, so that the lower-limit value of the heating temperature can be set at a low temperature as compared with any conventional method. Further, the heating temperature is set at a temperature lower than 400° C., whereby the decomposition pressure of a nitride compound semiconductor layer comes to be substantially zero, so that the dissociation of nitrogen atoms from the nitride compound semiconductor layer can be reliably prevented. Moreover, the heating temperature can be set at a temperature lower than that employed in any conventional method, no or little diffusion of the p-type impurity such as Mg takes place, or no or little disintegration of sharpness of an interface takes place in a superlattice structure by diffusion of atoms (for example, In) constituting the nitride compound semiconductor layer, so that the active layer, for example, of a semiconductor laser (LD) is deteriorated in no case or almost no case, whereby a high quality semiconductor laser (LD) can be produced. While it is required to carry out the heat-treatment for a long period of heating time period as compared with a conventional method, further, processing can be carried out in a large quantity at once so long as the heating temperature is lower than 400° C., so that the method of the present invention can comply with the mass-production of semiconductor devices. Further, when the heating temperature is lower than 400° C., no or little oxidation takes place on the surface of a nitride compound semiconductor layer although it differs depending upon a heat-treatment atmosphere. When a p-side electrode is formed on the surface of a nitride compound semiconductor layer after the heat treatment of the nitride compound semiconductor layer, it is required to remove an oxide layer on the surface of the nitride compound semiconductor layer. When the heating temperature is lower than 400° C., however, it is easier to remove the oxide layer formed on the surface of the nitride compound semiconductor layer.

What is claimed is:

1. A method of decreasing the resistance of and activating a nitride compound semiconductor layer doped with a p-type impurity, said method comprising heating a nitride compound semiconductor layer doped with a p-type impurity, at a temperature that is at least 200° C. but less than 400° C. for at least 200 minutes, in one atmosphere selected from;

(A) aerial atmosphere, (B) an atmosphere supplied with an oxygen gas and a hydrogen gas, (C) an atmosphere supplied with an oxygen gas and steam, (D) an atmosphere supplied with an oxygen gas, a hydrogen gas and steam, (E) an inert gas atmosphere containing steam, or (F) a reduced-pressure atmosphere containing steam and having a pressure lower than atmospheric pressure, and forming on the surface of said nitride compound semiconductor layer a hydrogen-permeable film, said hydrogen-permeable film having a thickness to prevent the dissociation of nitrogen atoms from the nitride compound semiconductor layer by the heat treatments, wherein dissociation of hydrogen in said nitride compound semiconductor layer is promoted and wherein said dissociation decreases the resistance of and activates said nitride compound semiconductor layer.

2. The method of decreasing the resistance of and activating the nitride compound semiconductor layer according to claim 1, wherein said hydrogen-permeable film is formed by a physical-vapor deposition method or a chemical vapor deposition method.

3. The method of decreasing the resistance of and activating the nitride compound semiconductor layer according to claim 1, wherein the nitride compound semiconductor layer is heated for at least 500 minutes.

4. A method of producing a semiconductor device, including a step of decreasing the resistance of and activating a nitride compound semiconductor layer doped with a p-type impurity, said step comprising heating a nitride compound semiconductor layer doped with a p-type impurity at a temperature that is at least 200° C. but less than 400° C. for at least 200 minutes, in one atmosphere selected from;

(A) aerial atmosphere, (B) an atmosphere supplied with an oxygen gas and a hydrogen gas, (C) an atmosphere supplied with an oxygen gas and steam, (D) an atmosphere supplied with an oxygen gas, a hydrogen gas and steam, (E) an inert gas atmosphere containing steam, or (F) a reduced-pressure atmosphere containing steam and having a pressure lower than atmospheric pressure, and forming on the surface of said nitride compound semiconductor layer a hydrogen-permeable film, said hydrogen-permeable film having a thickness to prevent the dissociation of nitrogen atoms from the nitride compound semiconductor layer by the heat treatment, wherein dissociation of hydrogen in said nitride compound semiconductor layer is promoted and wherein said dissociation decreases the resistance of and activates said nitride compound semiconductor layer.

5. The method of producing a semiconductor device according to claim 4, wherein said hydrogen-permeable film can be formed by a physical-vapor deposition method or a chemical vapor deposition method.

6. The method of producing a semiconductor device according to claim 4, wherein the nitride compound semiconductor layer is heated for at least 500 minutes.

* * * * *